(12) United States Patent
Blom et al.

(10) Patent No.: US 7,207,729 B2
(45) Date of Patent: Apr. 24, 2007

(54) TO-CAN HAVING A LEADFRAME

(75) Inventors: Claes Blom, Skänninge (SE); Nivardo Davila Albornoz, Skärholmen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 361 days.

(21) Appl. No.: 10/473,182

(22) PCT Filed: Mar. 22, 2002

(86) PCT No.: PCT/SE02/00582

§ 371 (c)(1),
(2), (4) Date: Jul. 29, 2004

(87) PCT Pub. No.: WO02/078409

PCT Pub. Date: Oct. 3, 2002

(65) Prior Publication Data

US 2004/0247259 A1    Dec. 9, 2004

(30) Foreign Application Priority Data

Mar. 22, 2001   (SE) .................................... 0101006

(51) Int. Cl.
*G02B 6/42*       (2006.01)

(52) U.S. Cl. ............................. 385/90; 385/78; 385/92
(58) Field of Classification Search ............ 385/88–94, 385/76–78
See application file for complete search history.

(56) References Cited

U.S. PATENT DOCUMENTS 5,577,145 A * 11/1996 Musk ........................... 385/88
5,963,696 A * 10/1999 Yoshida et al. ............... 385/91
6,126,325 A * 10/2000 Yamane et al. ............... 385/92

FOREIGN PATENT DOCUMENTS

JP              6164099 A      4/1994
JP              6164099   *    6/1994

* cited by examiner

*Primary Examiner*—Sung Pak
*Assistant Examiner*—Jarry T. Rahll

(57) ABSTRACT

The present invention relates to a TO-can type encapsulating element for enclosing, either hermetically or non-hermetically, optical-electrical chips with integrated optical element interfaces, detachable fibres and leadframes. The TO-can/encapsulating element enables the optical fibre (9) to be readily positioned relative to the chip (25) with the aid of a fix-able can-flange (7), and eliminates the risk of crack formation by virtue of the component leads of said TO-can having been provided with and connected to a leadframe (6).

2 Claims, 4 Drawing Sheets

TO-CAN HAVING A LEADFRAME

FIELD OF INVENTION

The present invention relates to a can for the hermetic or non-hermetic enclosure of an optical-electric chip that includes an integrated optical element interface, a detachable fibre pigtail and a leadframe.

DESCRIPTION OF THE BACKGROUND ART

The technique of encapsulating optical-electric chip in so-called TO-cans (TO/Transistor Outline) provides obvious advantages with respect to maintaining stable positioning of, for instance, an optical fibre relative to an optical-electric chip in environments of changing temperatures. In present day technology, lenses are often used to maintain an acceptable coupling between fibres and chip, which renders the cost involved unacceptable in the case of certain applications. TO-cans/encapsulations may include a receptacle that can be detached from the can, although this optical element interface has often been produced in an unnecessarily expensive manner with regard to the choice of material and design. When TO-cans have been mounted on a printed circuit board, their component leads have normally been bent down towards the board, which may have a negative affect on the transmission properties at high frequencies in some contexts. There is also a risk of the formation of microcracks in the glass transit that embrace the component leads in the mounting base of the TO-can. Little account is often paid to the fact that transmission at high frequencies can be improved when the transmission conductor has conductors with 0-potential on two sides.

SUMMARY OF THE INVENTION

The structural design outlined in FIG. 1 includes a component that has several significant properties. Positioning of an optical fibre in relation to an optical-electric chip can be achieved relatively simply, by moving a ferrule in two dimensions until coupling of the light is satisfactory (see FIG. 2). The ferrule can then be fixed by laser welding, gluing or soldering processes.

The so-called TO-can shown in FIG. 1 also includes a ferrule interface which enables two ferrules with optical fibres to be coupled in relation to each other in a guide sleeve. The optical interfaces of the fibre ends are brought into contact with each other with the aid of a locking sleeve that includes a bayonet fitting, which subsequent to being pressed and rotated ensures that a spring pressure can be maintained for mutual contact of said ends during operation.

To eliminate the risk of the formation of micorcracks among other things, the component leads of the TO-can have been provided with a leadframe, the construction of which can be seen from FIG. 3. The leadframe with its short lead-ins together with the positioning of the earth leads of the mounting base on both sides of the transmission conductor ensures that the transmission properties will be good and that stable positioning between a fibre and an optical-electric chip can be maintained.

The leadframe can be soldered to the mounting base leads or fastened thereto in some other way, to create a low-resistance connection. The leadframe can be further supported against the mounting base with a glue joint, an injection moulded joint or a compression moulded joint. At this stage, all leads are short-circuited to a common potential, which is beneficial from an electric discharge aspect (ESD).

As will be evident from the markings in FIG. 3, the leadframe can then be split up (clipped) to separate the individual leads and to adapt said leads for mounting on the printed circuit board. With the intention of achieving component stability when mounting the component on the printed circuit board, a combined support leg and mounting leg have been placed on the end wall of the can, as will be seen from FIG. 1. The entire component or parts thereof may be enclosed in a thermoplastic or thermosetting material.

The invention will now be described in more detail with reference to a preferred embodiment thereof and also with reference to the accompanying drawings.

DESCRIPTION OF PREFERRED EMBODIMENTS

Figure 1:
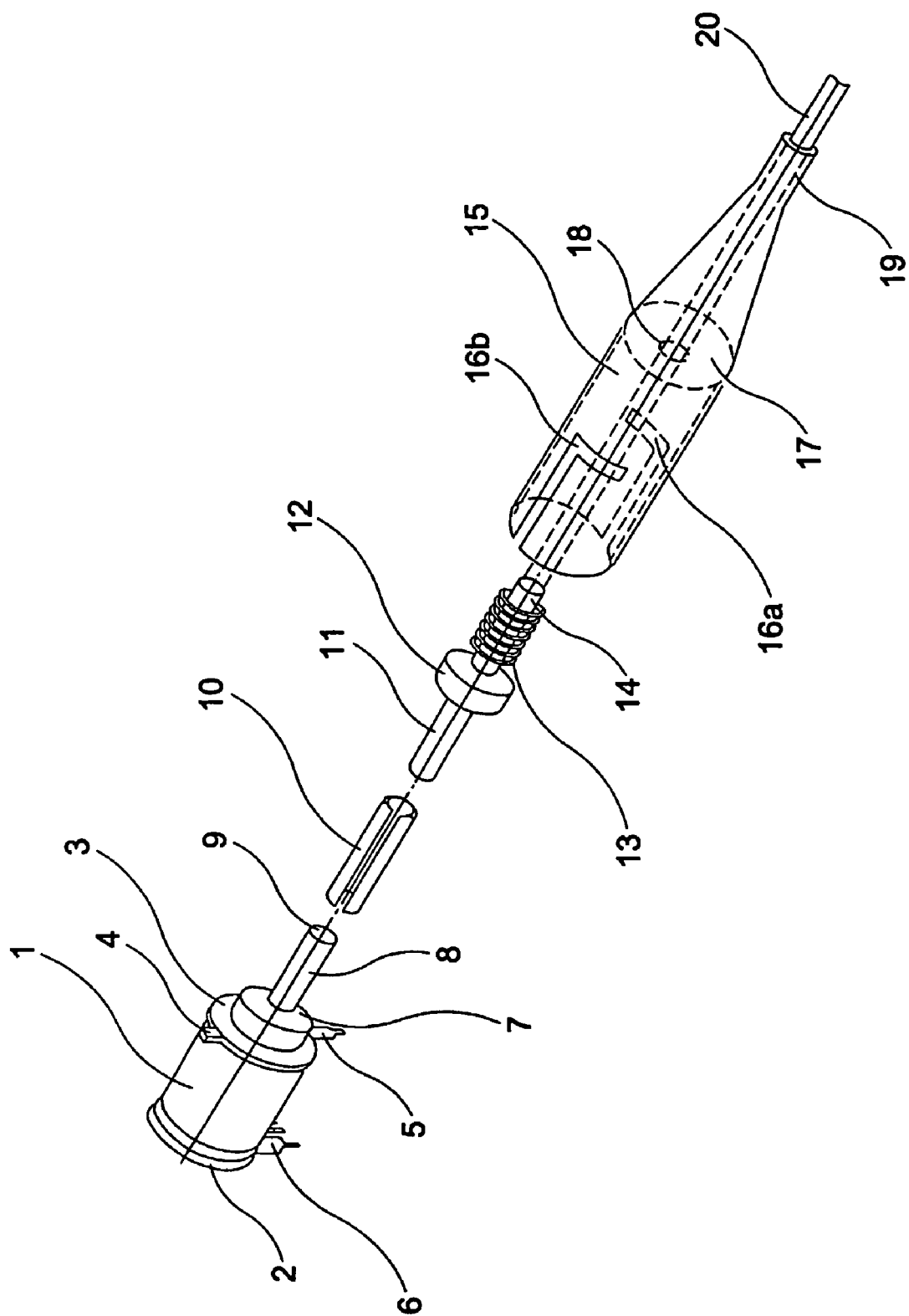
FIG. 1 is a partially exploded outline view of the various structural elements for effecting an optical-fibre connection to a TO-can.

FIG. 1 is a partially exploded perspective view of the various structural elements for connecting an optical fibre to a TO-can, where the can 1 includes a mounting base 2, a leadframe 6 and an end wall 3. The end wall 3 has a hook 4 and a hook leg 5. A capsule ferrule 8 having a capsule flange 7 is shown fitted to the end wall 3, with an optical fibre 9 disposed in a cylindrical cavity, where said optical fiber 9 is glued firmly inside the ferrule 8 or fastened thereto in some other way. An optical fibre 20 is shown partially bared and fitted in a ferrule 11 with its flange 12 and its guide 14. The guide 14 is surrounded by a coil spring 13. The capsule ferrule 8 with its optical fibre 9 is guided in relation to the ferrule 11 with its optical fibre 20 by means of a guide sleeve 10 which has been made resilient by slitting the sleeve or in some other way. A locking sleeve 15 runs on the optical fibre 20. The locking sleeve 15 has at least two locking recesses 16a and 16b, an end surface 17 and a guide hole 18. To prevent the fibre being broken, the locking sleeve 15 includes an integrated anti-break element 19 formed integrally with the locking sleeve 15.

The structural elements illustrated in FIG. 1 are assembled by pressing one end of the guide sleeve 10 onto the ferrule 8, wherewith the guide sleeve 10 yields slightly and therewith embrace the ferrule 8. The ferrule 11 is pressed into the other end of the guide sleeve 10, so as to be enclosed therein. The locking sleeve 15 with its locking recesses 16a and 16b is moved towards the hook 4 and the hook leg 5, so that the hook 4 and the hook leg 5 can be guided into the locking recesses 16a and 16b and the guide 14 can enter the hole 18, wherewith the coil spring is brought into contact with the end surface 17. The locking sleeve 15 is pressed further towards the mounting base 2, so as to compress the coil spring 13 between the flange 12 and the end surface 17, therewith bringing the optical fibre 9 in the ferrule 8 into contact with the optical fibre 20 in the ferrule 9, wherewith an optical contact element can be releasably attached to the capsule with the aid of the mutually opposing ferrule interfaces. A fibre pigtail can be releasably mounted on the component, by clockwise rotation of the locking sleeve 15 until the hook 4 and the hook leg 5 reach the end position of respective locking recesses 16a, 16b.

Figure 2:
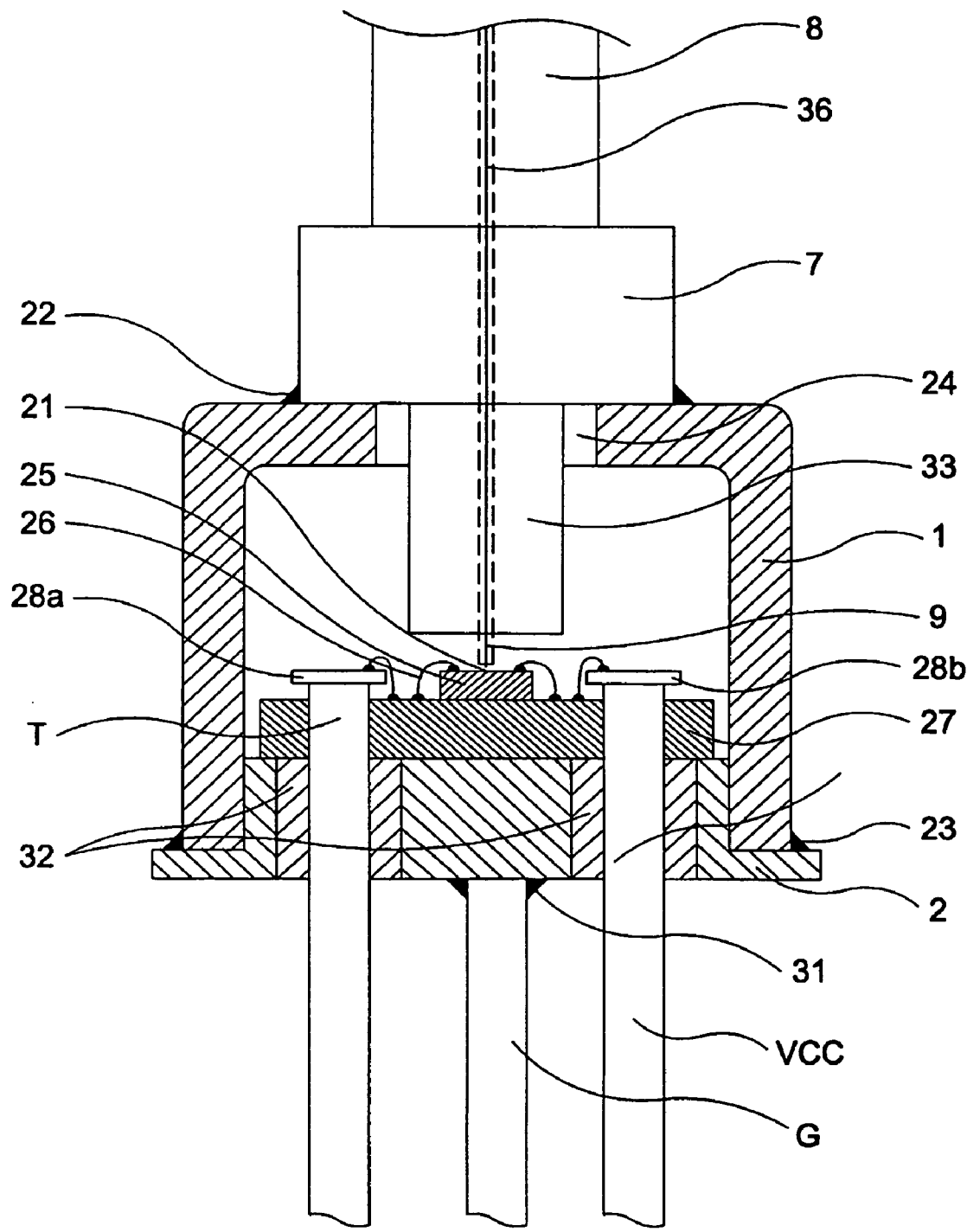
FIG. 2 is a cross-sectional view of a TO-can arranged in accordance with the invention and mounted in the absence of a leadframe.

FIG. 2 is a detailed cross-sectional view of the various structural elements of a TO-can according to the invention, where the cylindrical can 1 is fastened to the cylindrical mounting base 2 with the aid of a can joint 23. At least one ground lead G is fastened to the mounting base 2 with the aid of a lead joint 31, such that the ground lead is able to function as a cooling sink and as an electrical 0-potential from the mounting base 2 down towards a printed circuit board for instance. The mounting base also includes at least one transmission lead T and one current supply lead Vcc each having lead ledges 28a and 28b. The leads are surrounded by electrically insulated transits or leadthroughs 32 at the places where the transmission lead T and the current supply lead Vcc penetrate the mounting base 2. One or more carriers 27 are glued or soldered firmly to the upper side of the mounting base 2, and one or more optical-electrical chips 25 are glued or soldered firmly to the upper surface of said carrier. Subsequent to being optimised, the cylindrical ferrule 8 with its fixable flange 7 and its cylindrical ferrule-part 33 are secured to the upper side of the can 1 with a so-called ferrule joint 22 by means of a laser welding, soldering or gluing process. An optical fibre 36 is secured within the ferrule 8, by means of a clamping action, a gluing process or a soldering process. The optical fibre 36 has an outwardly protecting part 9 which is adapted so that the ferrule-part 33 will not come into contact with a bonding wire 26 or other wires. Because the can includes means for positioning a connected optical fibre to the optical-electrical component without the use of lens elements, and because the ferrule 8 is moved in an x-direction and a y-direction over the can 1 in its cylindrical recess 24, optimisation can be achieved with respect to light incoming from the optical fibre 36 to the optical-electrical chip 25 with its optically active area 21 or, when the optical-electrical chip 25 is a light emitting component, the chip 25 can transmit light from the optical ares 21 to the optical fibre 36 in an optimised manner.

Figure 3:
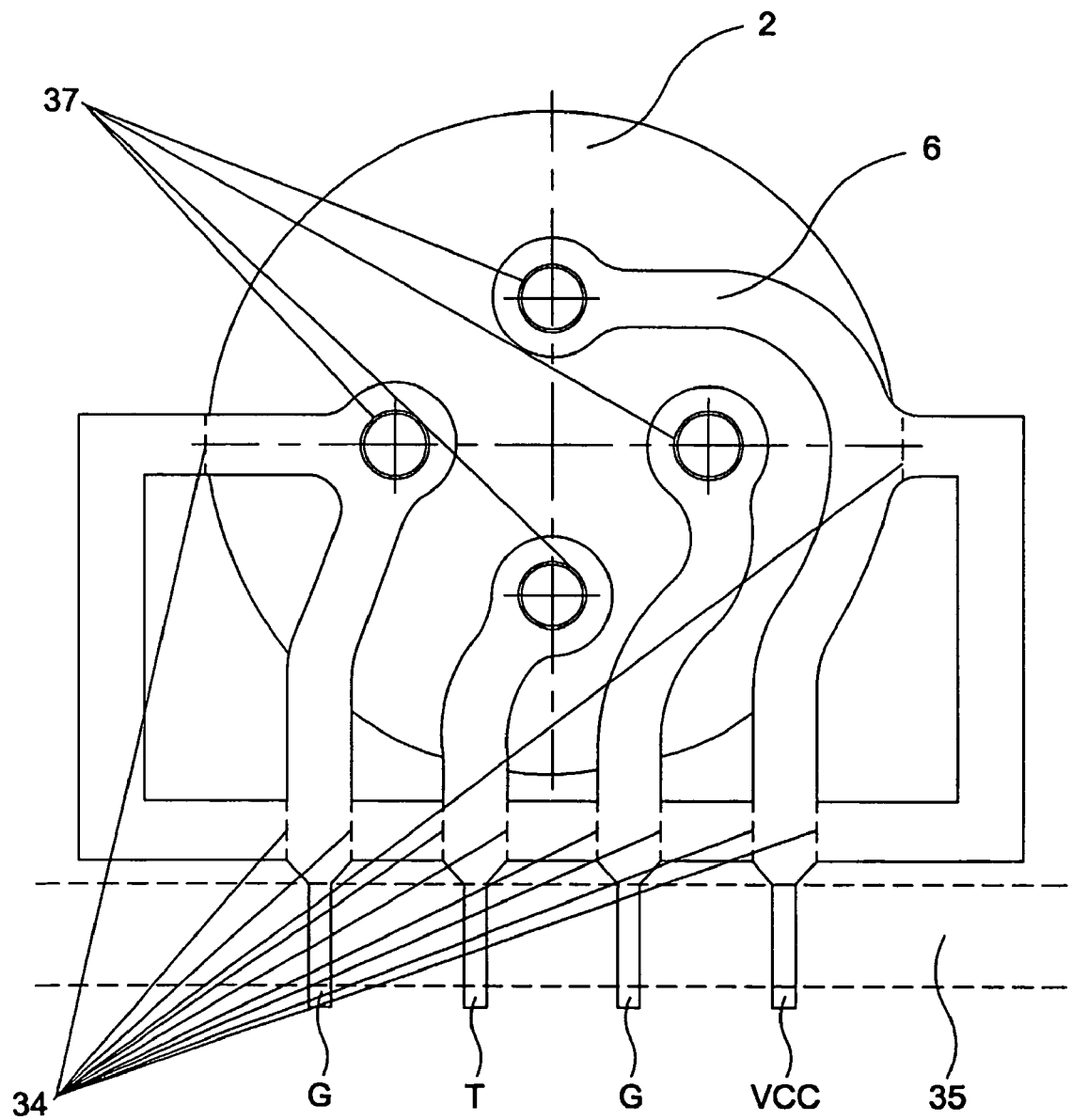
FIG. 3 shows a leadframe mounted on the leads of the TO-can.

FIG. 3 is a view taken from beneath the mounting base 2 and shows the ground lead G, the transmission lead T and the power supply lead Vcc of said base, said leads having been connected to a leadframe 6. The leadframe 6 is configured so that the ground lead G extends on both sides of the transmission lead T, therewith contributing towards limiting the distortion at high bit rates and, at the same time, functioning as symmetrical cooling sinks between the mounting base 2 and a printed circuit board 35 together with its metal conductors. The leadframe 6 is mounted with the leads in joins 37, which have been produced by crimping, laser welding or soldering, or by some other appropriate joining method, whereafter the leadframe 6 has been divided at cutting locations 34, so as to separate the various leads in the leadframe. The lead separated in the leadframe are length matched/impedance matched to obtain optimal transmission properties.

Figure 4:
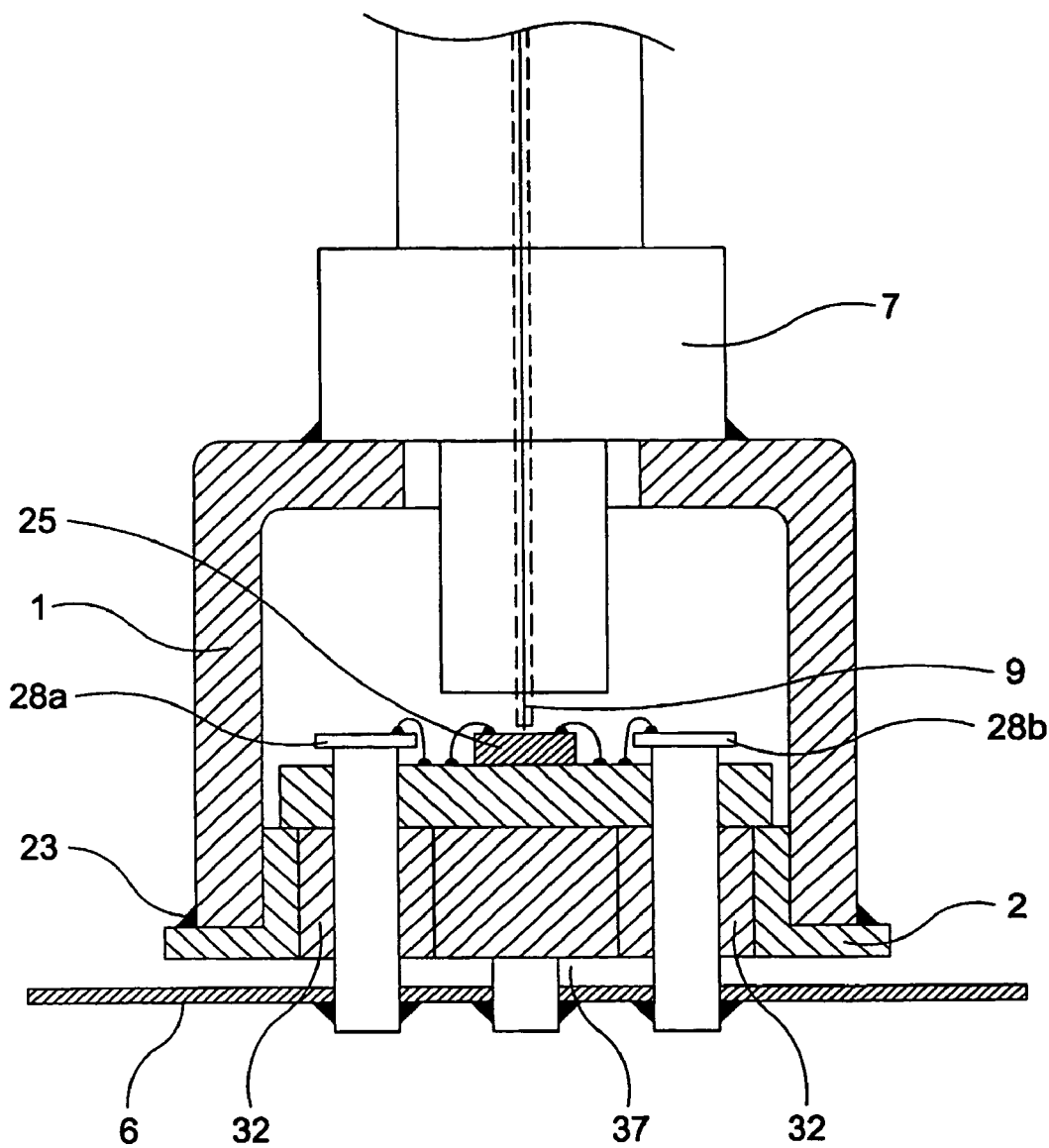
FIG. 4 is a cross-sectional view of the TO-can arranged in accordance with the invention and mounted with a leadframe.

FIG. 4 is a detailed cross-sectional view illustrating the various structural elements in the TO-can, and shows the cylindrical can 1 secured to the cylindrical mounting base 2 by can joints 23, and the leadframe 6 connected to the leads T, G and Vcc. The ground lead G is fastened to the mounting socket with the aid of lead joints in a manner to enable the ground lead to function as a cooling sink and an electric 0-potential from the mounting base down to a printed circuit board for instance. The mounting base includes at least one transmission lead T and one power supply lead Vcc, each having a respective lead ledge 28a and 28b. The leads are surrounded by said electrically insulated transits or leadthroughs 32 at the place where the transmission lead T and the power supply lead Vcc penetrate the mounting base 2. The leadframe 6 is configured so that the ground leads G will extend on respective sides of the transmission lead T. The leadframe 6 is fastened with the leads in joins 37, which have been made by crimping, laser welding or soldering or in some other suitable way, whereafter the leadframe 6 has been divided at the cutting locations 34 so as to provide mutually separate and length-matched conductors to the various leads, which are then cut slightly beyond the joins 37.

It will be understood that the invention is not restricted to the aforedescribed and illustrated exemplifying embodiments thereof and that modifications can be made within the scope of the accompanying claims.

The invention claimed is:

1. A TO-can type encapsulating element enclosing at least one optical-electrical chip comprising an integrated optical-element interface, detachable fibre pigtail and leadframe, wherein:
   a.) leads are connected to said leadframe, of which different legs are provided to be formed after separation by cutting locations on the leadframe, wherein the leads of the leadframe are length adapted or impedance matched for optimal transmission properties;
   b.) the can is provided with a recess for inserting a ferrule-part with at least one optical-fibre to an inner space of the can;
   c.) means for positioning the optical-fibre are provided to regulate the installation of the optical fibre in the recess towards an opto-electrical component disposed within said inner space of said can, whereby optimisation of in-going light from the optical-fibre to the chip, or out-going light from the chip to the optical-fibre, is possible.

2. The TO-can type encapsulating element according to claim 1, wherein an optical contact element is attached to or released from the can with the aid of mutually opposing ferrule interfaces.

* * * * *